June 24, 1958 A. A. HEMPHILL ET AL 2,840,712
COMBINED OSCILLATOR AND BALANCED MODULATOR
Filed March 4, 1957
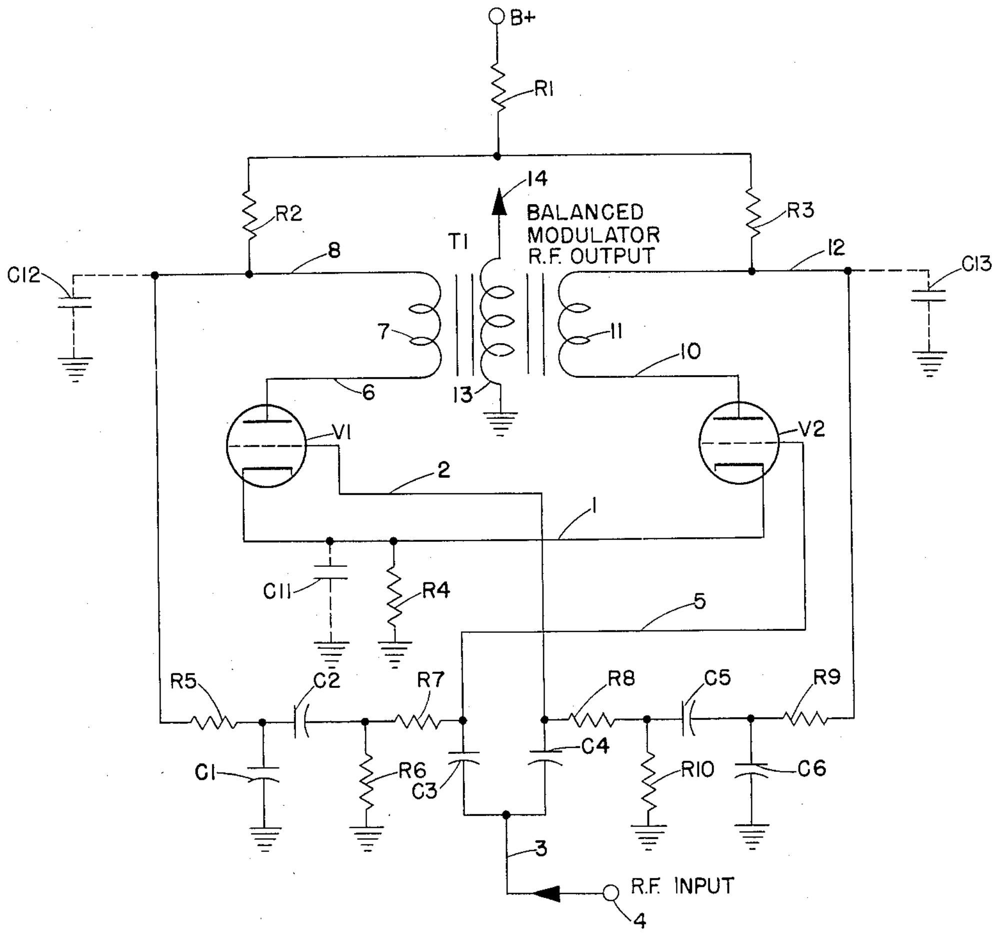
ALFRED A. HEMPHILL
JOHN M. TEWKSBURY
INVENTOR
BY Killman and Kerst
ATTORNEY United States Patent Office 2,840,712

Patented June 24, 1958

2,840,712

COMBINED OSCILLATOR AND BALANCED MODULATOR

Alfred A. Hemphill and John M. Tewksbury, Baltimore, Md., assignors to Bendix Aviation Corporation, Towson, Md., a corporation of Delaware Application March 4, 1957, Serial No. 643,644

3 Claims. (Cl. 250—36)

This invention relates to a circuit which will, in response to only a radio frequency input, produce an output consisting of side-band frequencies resulting from the modulation of the radio frequency input by an audio frequency.

Such circuits are useful in automatic radio compass receivers. In producing this type of output, it has been customary, in the past, to utilize separate balanced modulator and audio oscillator circuits. The balanced modulator usually consisted of two tubes having their grids connected in parallel for radio frequencies, while their plates were connected in push-pull. A radio frequency signal was applied to the grids in parallel and an audio signal from an audio oscillator was applied in push-pull to the grids as a modulating signal. Without the audio signal, the outputs of the two tubes would cancel with the result that the circuit would have no output. Application of the push-pull audio signal causes the conductances of the two tube sections to vary in alternation to provide a resultant radio frequency output consisting of side-bands with no carrier frequency. This output in a direction finder is added to a sense signal and produces a type of modulation phenomena which is used for loop directing purposes.

In such circuits it is desirable to be able to carry on conventional radio reception with the loop antenna. In order to do this, it has been necessary to disconnect the oscillator and to adjust the bias of one tube section of the modulator to cutoff, in order that the carrier might be amplified.

For direction finder purposes it is desirable that the output envelope of the balanced modulator consist of a succession of half sine waves. This required careful adjustment of the audio oscillator signal in order to prevent clipping or insufficient modulation. It was necessary to compensate for any unbalance existing in the system.

It is an object of the present invention to provide a two tube circuit performing both the functions of an audio oscillator and a balanced modulator utilizing the signal of the audio oscillator to provide a signal consisting only of side-band frequencies.

It is a further object of the invention to provide a circuit producing such a signal and affording a substantial saving in tubes, components, and power requirements over the prior art.

It is another object of the invention to provide such a circuit which requires less complication in switching from direction finder operation to normal aural reception.

It is still another object of the invention to provide such a circuit which lends itself readily to self-balancing.

It is a further object of the invention to provide such a circuit in which operation ceases upon the failure of one tube, thus reducing bearing errors caused by erratic balanced modulator operation.

These and other objects and advantages of the invention are realized in a two tube circuit in which the grid of each tube is coupled to the plate of the other tube by means of a phase shifting network which causes the two tubes to operate as a phase shift oscillator and in which provisions are made for applying a radio frequency input signal in parallel to the control grids of the two tubes and their plates are transformer coupled by means of a transformer having two primaries wound in opposition and a secondary which provides the circuit output.

In the drawing, the single figure is a schematic diagram of a circuit embodying the invention.

Referring now more particularly to the drawing, there is shown a pair of triodes V1 and V2 having their cathodes joined by the conductor 1 and connected to ground by way of a resistor R4 which is by-passed for radio frequencies by a capacitor C11. The grid of V1 is connected by conductor 2, a capacitor C4, and a conductor 3 to a radio frequency input terminal 4. The grid of V2 is connected by a conductor 5, a capacitor C3 and conductor 3 to the same radio frequency input terminal 4. The plate of tube V1 is connected by a conductor 6 to one terminal of the primary winding 7 of a transformer T1. The other terminal of this winding is connected by a conductor 8 and by a capacitor C12 to ground for radio frequencies, and by a series arrangement consisting of a resistor R5, a capacitor C2, and a resistor R7 to the conductor 5. The junction of resistor R5 and capacitor C2 is connected to ground by way of a capacitor C1. The junction of capacitor C2 and resistor R7 is connected to ground by way of a resistor R6.

The plate of the tube V2 is connected by a conductor 10 to one terminal of a secondary winding 11 of transformer T1. The remaining terminal of this winding is connected by way of a conductor 12 and a series string of components consisting of a resistor R9, a capacitor C5, and a resistor R8 to the conductor 2. It is also connected to ground for radio frequencies by a capacitor C13. The junction of resistor R8 and capacitor C5 is connected to ground by way of a resistor R10. The junction of capacitor C5 and resistor R9 is connected to ground by way of a capacitor C6. Conductor 8 is connected by way of a resistor R2 and conductor 12 is connected by way of a resistor R3 to one terminal of a resistor R1, the remaining terminal of which is connected to a source of plate supply voltage indicated as B+.

The transformer T1 has a secondary winding 13, one terminal of which may be grounded and the remaining terminal of which is the output terminal 14.

In the operation of the circuit described above the plate V1 is coupled by way of the components C1, C2, R5, R6, and R7, which constitute a phase shifting network, to the grid of tube V2. Likewise the plate of tube V2 is coupled by way of a phase shifting network, comprising the components C5, C6, R8, R9, and R10, to the grid of tube V1. The radio frequency input to the circuit is from the terminal 4 in parallel to the grids of both tubes.

The primary windings 7 and 11 of transformer T1 are wound in opposition to each other and, thus, completely suppress the carrier output from the two tubes.

The time constants of the two phase shifting networks are so chosen that tubes V1 and V2 function as an audio phase shift oscillator. As the audio oscillator function changes the potential of the grids at an audio rate, the respective transconductances of the tube sections are altered in alternation with corresponding changes in their amplification factors and the circuit thereby produces a radio frequency output at the terminal 14 which consists only of the side-bands.

The circuit presents a number of advantages over the conventional arrangement of separate audio oscillator and balanced modulator. It effects a pronounced saving of tubes, components, and power requirements. It requires a less complicated switching system to change a receiver, incorporating the circuit, from its direction finding function to normal aural reception, since it is necessary merely to stop the oscillation by cutting the plate supply of one of the tubes. The bias on the tube which remains active will be correct.

The degree of transconductance which is due to the audio oscillation is maintained at a uniform level, since the phase shift oscillator has the property of automatically adjusting its amplitude as a function of transconductance.

The circuit renders itself adaptable to simple self-balancing arrangements for insuring the balance of the modulator function.

Bearing errors resulting from erratic operation of a conventional type balanced modulator are greatly reduced in this circuit. This is due to the fact that the failure of one tube causes the oscillations to stop and thus renders the system fail-safe in operation.

What is claimed is:

1. A combined oscillator and balanced modulator circuit comprising a pair of electron tubes each having a plate, a cathode and a control grid, phase shifting means coupling the plate of each of said tubes to the control grid of the other, means connecting said cathodes together and providing a common impedance between said cathodes and a ground reference plane, means applying a radio frequency signal in parallel to said control grids, and means combining the outputs of said tubes in phase opposition, the time constants of said coupling means between said plates and said grids being such as to cause said circuit to oscillate at a frequency lower than that of said radio frequency signal.

2. A combined oscillator and balanced modulator circuit comprising a pair of electron discharge tubes each having a plate, a cathode and a control grid, a pair of phase shifting networks, means connecting each of said phase shifting networks between the plate of a respective one of said tubes and the control grid of the other, means connecting said cathodes together, a resistor connected between said cathodes and a ground reference plane, means applying a radio frequency signal in parallel to said control grids, and means combining the outputs of said tubes in phase opposition, the time constants of said phase shifting networks being such as to cause said circuit to oscillate at a frequency lower than that of said radio frequency signal.

3. A combined oscillator and balanced modulator circuit comprising a pair of electron discharge tubes each having a plate, a cathode and a control grid, a pair of phase shifting networks, means connecting each of said phase shifting networks between the plate of a respective one of said tubes and the control grid of the other, means connecting said cathodes together, a resistor connected between said cathodes and a ground reference plane, means applying a radio frequency signal in parallel to said control grids, and means combining the outputs of said tubes in phase opposition, the time constants of said phase shifting networks being such as to cause said circuit to oscillate at a frequency lower than that of said radio frequency signal, the last named means comprising a transformer having a pair of oppositely wound primary windings, each of said primary windings being connected to the plate of a respective one of said tubes.

References Cited in the file of this patent

UNITED STATES PATENTS 1,559,116 Marrison -------------- Oct. 27, 1925